US009991139B2

(12) United States Patent
Oosterlaken et al.

(10) Patent No.: US 9,991,139 B2
(45) Date of Patent: Jun. 5, 2018

(54) MODULAR VERTICAL FURNACE PROCESSING SYSTEM

(71) Applicant: ASM IP HOLDING B.V., Almere (NL)

(72) Inventors: Theodorus G. M. Oosterlaken, Almere (NL); Chris G. M. de Ridder, Almere (NL); Bert Jongbloed, Almere (NL)

(73) Assignee: ASM IP HOLDING B.V., Almere (NL)

( * ) Notice: Subject to any disclaimer, the term of this patent is extended or adjusted under 35 U.S.C. 154(b) by 202 days.

(21) Appl. No.: 14/648,380

(22) PCT Filed: Dec. 3, 2013

(86) PCT No.: PCT/NL2013/050868
§ 371 (c)(1),
(2) Date: May 29, 2015

(87) PCT Pub. No.: WO2014/088414
PCT Pub. Date: Jun. 12, 2014

(65) Prior Publication Data
US 2015/0303079 A1 Oct. 22, 2015

Related U.S. Application Data

(60) Provisional application No. 61/732,477, filed on Dec. 3, 2012.

(51) Int. Cl.
H01L 21/677 (2006.01)
H01L 21/67 (2006.01)
(Continued)

(52) U.S. Cl.
CPC .......... H01L 21/67098 (2013.01); B23P 6/00 (2013.01); F27B 1/20 (2013.01);
(Continued)

(58) Field of Classification Search
CPC ............ H01L 21/677; H01L 21/67161; H01L 21/67167; H01L 21/67184; H01L 21/6719; H01L 21/67201; Y10S 414/135–414/139
See application file for complete search history.

(56) References Cited

U.S. PATENT DOCUMENTS 6,277,199 B1   8/2001 Lei et al.
6,332,898 B1   12/2001 Tometsuka et al.
(Continued)

FOREIGN PATENT DOCUMENTS

EP   0560439    9/1993
JP   8-236411   9/1996
(Continued)

Primary Examiner — Gregory A Wilson
(74) Attorney, Agent, or Firm — Preti Flaherty Beliveau & Pachios LLP

(57) ABSTRACT

A vertical furnace processing system for processing semiconductor substrates, comprising the following modules: —a processing module including a vertical furnace; an I/O-station module including at least one load port to which a substrate cassette is dockable; a wafer handling module configured to transfer semiconductor substrates between the processing module and a substrate cassette docked to the load port of the I/O-station module; and a gas supply module including at least one gas supply or gas supply connection for providing the vertical furnace of the processing module with process gas, wherein at least two of the said modules are mutually decouplably coupled, such that said at least two modules are decouplable from one another to facilitate servicing of the system, and in particular the vertical furnace thereof.

24 Claims, 10 Drawing Sheets

(51) Int. Cl.
*B23P 6/00* (2006.01)
*F27B 1/20* (2006.01)
*H01L 21/673* (2006.01)
*H01L 21/687* (2006.01)

(52) U.S. Cl.
CPC ...... *H01L 21/6719* (2013.01); *H01L 21/6735* (2013.01); *H01L 21/67303* (2013.01); *H01L 21/67724* (2013.01); *H01L 21/67775* (2013.01); *H01L 21/68707* (2013.01)

(56) References Cited

U.S. PATENT DOCUMENTS

| | | | | |
|---|---|---|---|---|
| 6,663,332 | B1* | 12/2003 | Sluijk | H01L 21/67769 414/160 |
| 6,698,991 | B1* | 3/2004 | Bachrach | H01L 21/67196 414/217 |
| 9,048,271 | B2* | 6/2015 | Oosterlaken | H01L 21/67161 |
| 9,117,860 | B2* | 8/2015 | Boyd | H01L 21/288 |
| 2003/0044261 | A1 | 3/2003 | Bonora et al. | |
| 2008/0124194 | A1* | 5/2008 | van der Meulen | H01L 21/6719 414/217 |
| 2008/0124197 | A1* | 5/2008 | van der Meulen | B65G 25/02 414/217 |
| 2009/0101180 | A1 | 4/2009 | Jang et al. | |
| 2009/0165952 | A1* | 7/2009 | Tauchi | H01L 21/6719 156/345.32 |
| 2010/0329828 | A1 | 12/2010 | Kisimoto et al. | |
| 2013/0243550 | A1* | 9/2013 | Yasui | H01L 21/67115 414/217 |

FOREIGN PATENT DOCUMENTS

| | | |
|---|---|---|
| JP | 2001-210602 A | 8/2001 |
| JP | 2009-200159 A | 9/2009 |
| WO | WO 98/43283 | 10/1998 |
| WO | WO 2008/129617 | 10/2008 |

* cited by examiner

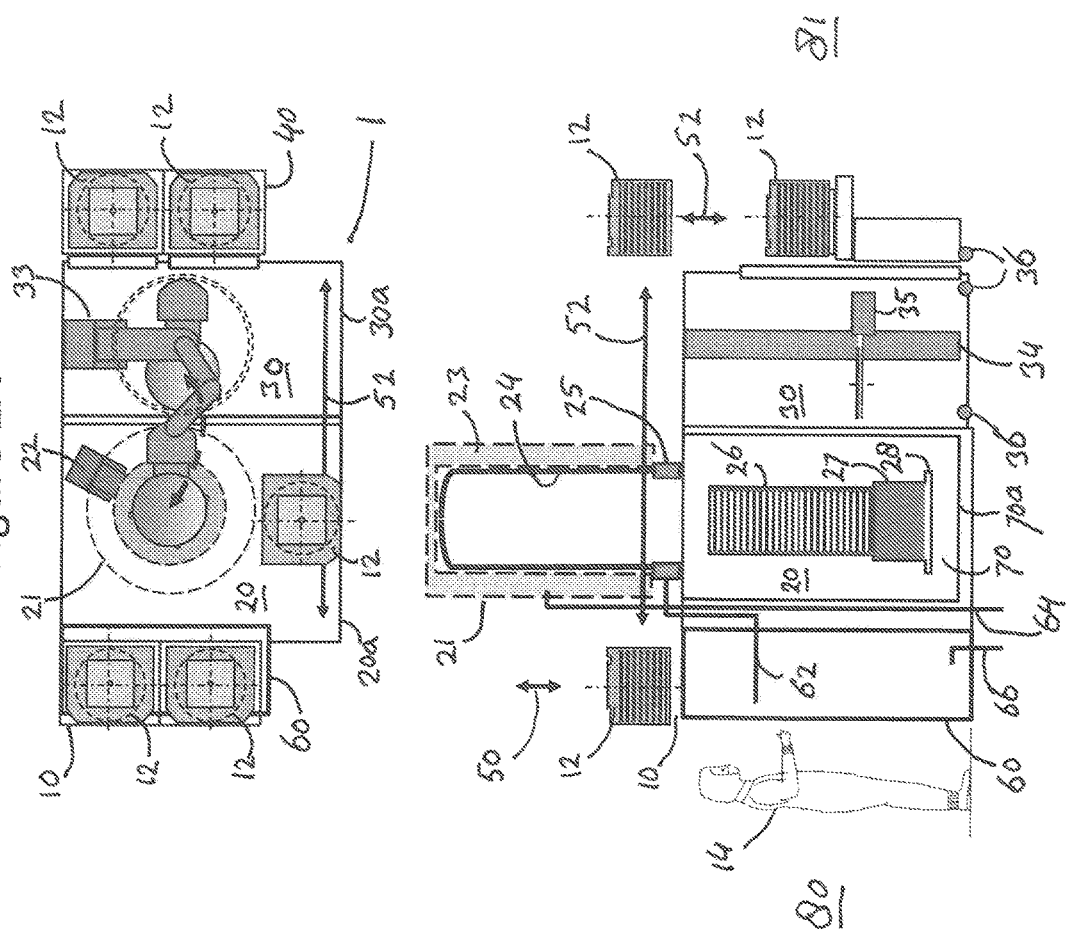

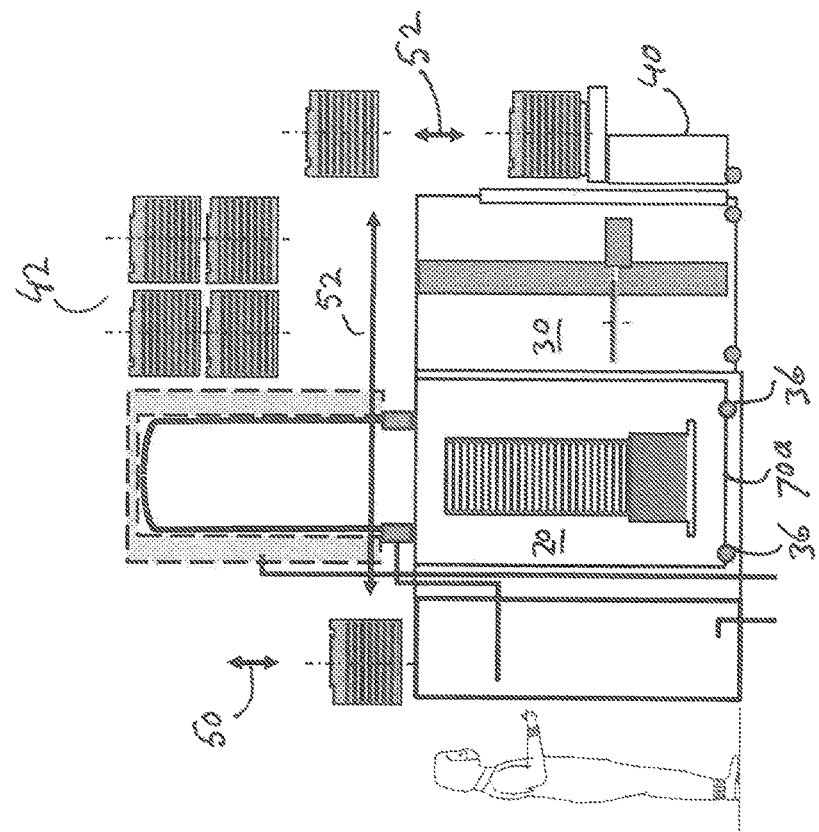
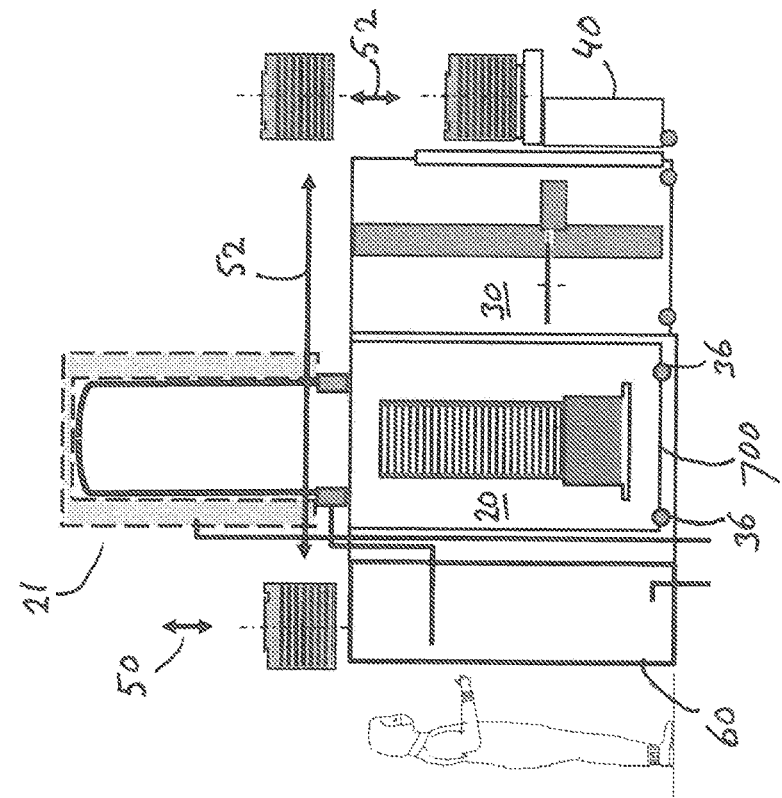

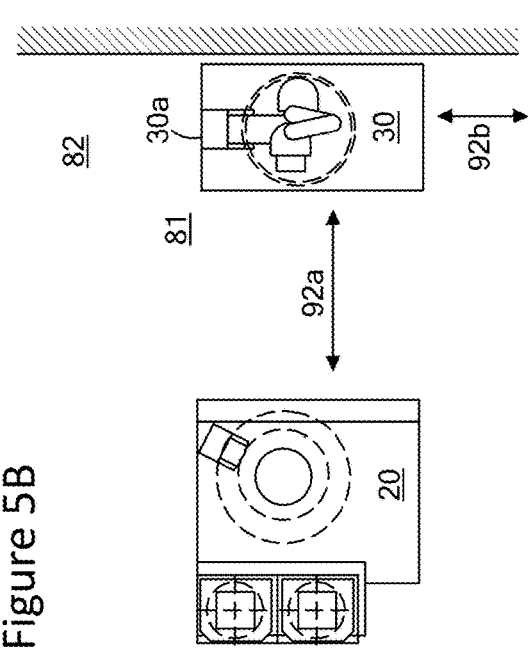
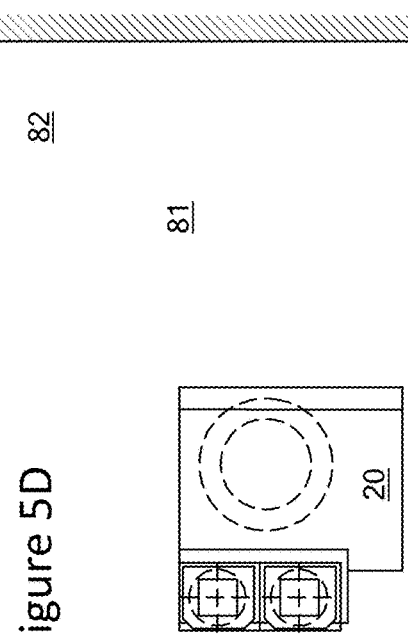
Figure 5B
Figure 5D
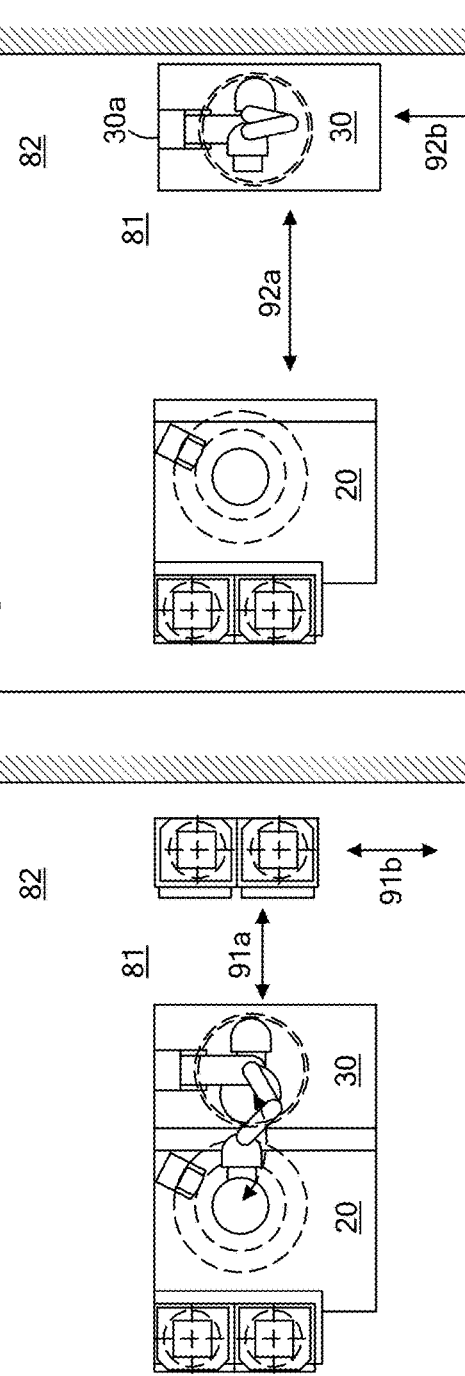
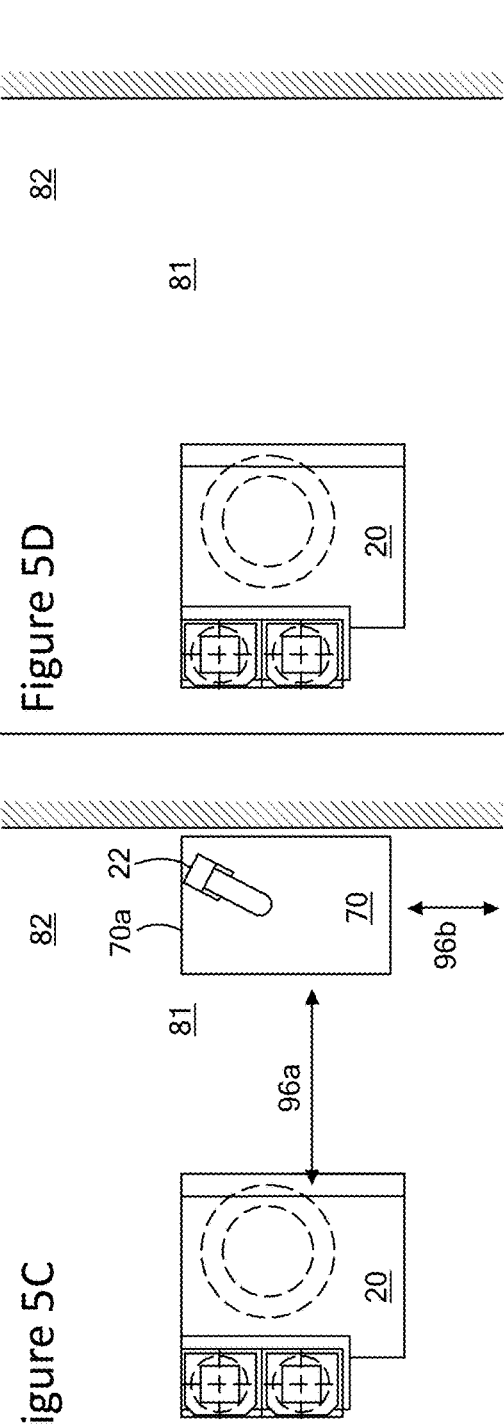
Figure 5A
Figure 5C

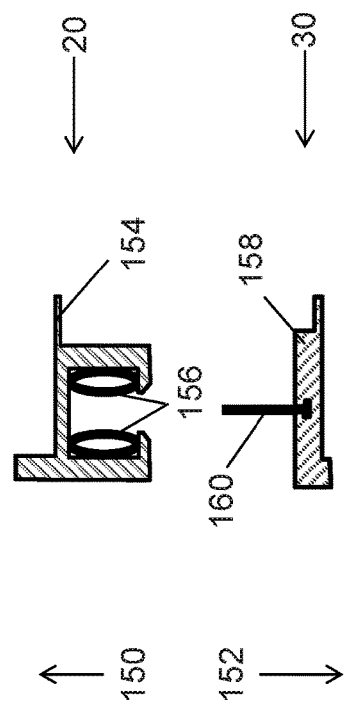
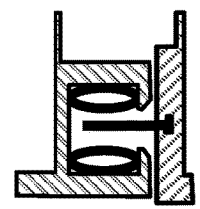
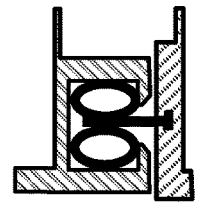
Fig. 9A
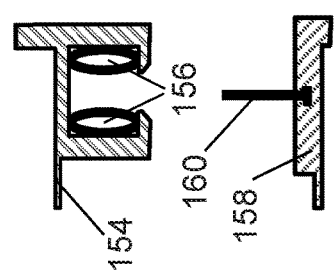
Fig. 9B
Fig. 9C

MODULAR VERTICAL FURNACE PROCESSING SYSTEM

FIELD OF THE INVENTION

The present invention relates to the field of semiconductor processing equipment, and more in particular to a modular vertical furnace processing system that facilitates servicing.

BACKGROUND

Semiconductor processing equipment for the processing of semiconductor substrates is typically placed in a clean room because clean, dust free processing is required. At the front side of the system, facing the clean room, substrate cassettes with wafers to be processed are received and substrate cassette handling and storage equipment and wafer handling equipment is typically provided. At the rear side of the system the processing chamber is provided and at the extreme end opposite to the clean room side a gas cabinet is provided with gas control components and optionally pressure control or vacuum components. Vertical furnaces for batch processing of substrates are preferably placed side by side, without any space in between the systems, to minimize the joint footprint of a plurality of systems. This implies that access to the system can only be provided at the front and the rear side and not via the sides.

A solution described in U.S. Pat. No. 6,332,898 (Tometsuka et al.) is that substrate cassette and wafer handling and storage components at the front side of the system are movable between a processing time position and a maintenance time position. When moved in a maintenance time position, the components can be accessed for maintenance from the front side of the system. The vertical furnace can be accessed from the rear side of the system.

However, the design proposed by US'898 has the disadvantage that all maintenance actions on the substrate cassette and wafer handling and storage components are performed in intimate communication with the clean room. E.g. if a wafer handling robot needs to be replaced, the broken robot and the replacement robot need to be transported through the clean room. Further, the substrate cassette handling and storage components and wafer handling components remain in the system and may hinder accessibility of other components. Further, a gas component cabinet is provided at the rear side of the system and this may hinder the accessibility of the vertical furnace when maintenance needs to be performed. During replacement of e.g. a quartz process tube, which is a large component, sufficient space needs to be available and the gas cabinet can be a significant obstacle.

With the transition to a wafer size of 450 mm all components grow in size and the space requirements become even stronger. For the handling of large components such as process tubes, flanges, heating elements etc. large tools are required that occupy a lot of space. A solution would be to place the gas cabinet remote from the vertical furnace with the disadvantage of long gas supply lines and control lines between furnace and gas cabinet.

SUMMARY OF THE INVENTION

It is an object of the present invention to obviate or at least mitigate one or more of the aforementioned problems and disadvantages, and to provide for a vertical furnace processing system with a system design that facilitates service access to all major components of the system.

It is another object of the present invention to provide for a semiconductor processing facility including one or more vertical furnace processing systems that are economically arranged and conveniently serviceable.

It is yet another object of the present invention to provide for a method of conveniently servicing a vertical furnace processing system.

To this end, a first aspect of the present invention is directed to a vertical furnace processing system according to claim 1.

A second aspect of the present invention is directed to a semiconductor processing facility including at least one vertical furnace processing system according to the first aspect of the invention, as defined by claim 15.

A third aspect of the present invention is directed to a method of servicing a vertical furnace processing system according to the first aspect of the invention, as defined by claim 18.

These and other features and advantages of the invention will be more fully understood from the following detailed description of certain embodiments of the invention, taken together with the accompanying drawings, which are meant to illustrate and not to limit the invention.

BRIEF DESCRIPTION OF THE DRAWINGS

FIG. 1A shows a top plan view and a side view of an embodiment of the invention;

FIGS. 1B and 1C show two other embodiments of the invention;

FIG. 5A-5D are top plan views corresponding to FIG. 4A-4D;

FIGS. 9A-9C show partial cross sectional views along a horizontal plane through the gates of the processing module and the wafer handling module in various stages of a decoupled condition to a coupled condition.

DETAILED DESCRIPTION

Figure 2A:
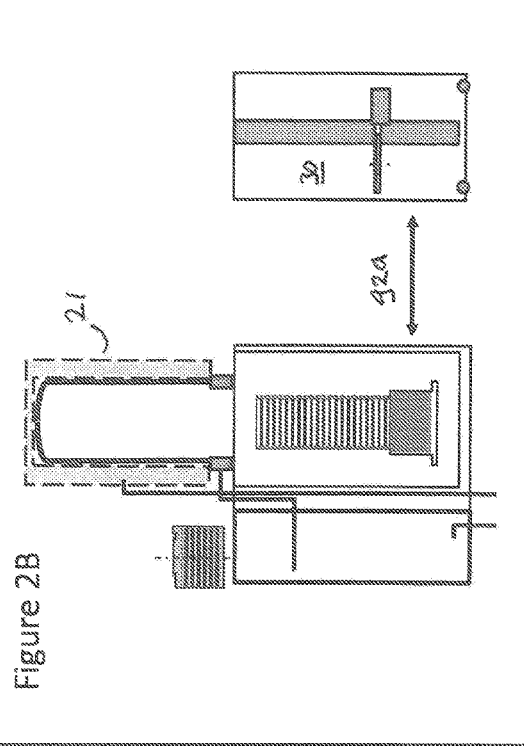
FIG. 2A-2D show in a side view sequential steps in a service operation of the system of FIG. 1A.

Below the invention is explained in general terms, and where appropriate with reference to the Figures, in which similar parts are indicated by similar reference numerals.

In FIG. 1A a vertical furnace processing system 1 comprises a substrate cassette receiving platform 10 for receiving substrate cassettes 12, a gas supply module 60, a processing module 20 having a housing 20a, a wafer handling module 30 having a housing 30a and a substrate cassette input/output (I/O)-station module 40.

The processing module 20 comprises a vertical furnace 21 in an upper region thereof, the furnace comprising a heating element 23 and a process tube 24 delimiting a reaction space and being supported on a flange 25. A housing around the vertical furnace 21 is typically provided but not shown for simplicity. A boat elevator 22 can move a wafer boat 26 holding a plurality of wafers into the process tube 24 from the space below and vice versa. The boat is supported on a pedestal 27 and a door plate 28. A mini-environment 70, comprising a housing 70a, is provided in the space below the furnace. Typically, mini-environment 70 may comprise a particle filter and a blower for circulating filter air or nitrogen (N$_2$), and cooling means for removing heat released after unloading a hot wafer boat.

The wafer handling module 30 may comprise a wafer handling robot 33 with an axis 34 for vertical movement and a multi axis arm 35 for gripping wafers. Further, wafer handling module 30 may comprise a particle filter and a blower both not shown, for circulating clean filtered air or nitrogen (N$_2$) in the wafer handling space.

The supply module 60 may accommodate all primary electrical components and process gas facilities, including for example pressure gauges, flow controllers, valves, a process gas controller, and peripheral equipment of the vertical furnace processing system 1, and distribute gas and electrical facilities to the processing module 20 including a vertical furnace 21, the wafer handling module 30 including a substrate handling robot 33, and the I/O-station module 40. The gas system in gas supply module 60 may be in communication with furnace 21 through gas conduits 62. Permanent connection with the facilities is schematically indicated with 64 for the power connection of the heating element to a power supply, typically located in a basement underneath the clean room 80 and not shown, and 66 for the connection of the gas supply module to the process gas facilities. The system 1 may be placed such that the gas supply module 60 faces the clean room 80 and the I/O-station module 40 is facing the service area or grey room 81. Operator 14 can access the gas supply module from the clean room 80 for performing service to the gas supply module.

Process module 20 and gas supply module 60 may be modules that are large in size and weight, and that are connected to each other and to the facilities through many complicated connections such as high power connection 64 and the gas connections 62 and 66 for a plurality of reactive process gases. The wafer handling module 30 and substrate cassette I/O-station module 40, on the other hand, may be relatively simple modules with a relatively simple connection to the facilities; e.g. connections for electrical power of modest wattage, electrical control signals, compressed air, vacuum (to enable vacuum suction gripping a wafer by the wafer handling robot) and nitrogen gas (N$_2$).

In an embodiment of the invention, one or more connections of wafer handling module 30 and I/O-station module 40 to the facilities and to the remainder of the system may be provided with connectors that allow easy disconnection and reconnection.

In another embodiment the wafer handling module 30 and/or I/O-station module 40 may be provided with supportive transport means 36, such as, for instance, wheels, a rail-guided carriage, or preferably gas/air cushion devices or generators for generating gas/air cushions, so that they may easily be removed from the system 1 and reinserted again. Wafer handling module 30 may be removed in its entirety, i.e. together with housing 30a, wafer handling robot 33, and particle filter, so that all its components are protected and remain clean.

Substrate cassettes 12 may typically be supplied to the substrate cassette receiving platform 10 from the clean room side by a an Over Head Transport (OHT) system indicated by 50, and then be transported to the opposing side of the system 1, namely to the I/O-station module 40, by a substrate cassette transport mechanism 52. In another embodiment, the OHT system 50 may supply the substrate cassettes 12 directly to the I/O-station module 40 in the service area or grey room 81. Optionally, a clean corridor may then be provided for the part of the OHT system 50 that is located in the service area 81.

In FIGS. 1B and 1C two alternative embodiments are shown. Only the differences with FIG. 1A will be explained.

As illustrated in FIG. 1B, the housing 70a of the mini-environment 70 may be provided with supportive transport means 36, while the connections of the mini-environment 70 to the facilities and remainder of the system 1 may be provided with connectors allowing easy disconnection and reconnection. Access for servicing the furnace 21 may be provided for by disconnecting and removing mini-environment 70, including housing 70a.

FIG. 1C shows an embodiment similar to the one of FIG. 1B with additional storage locations 42 for substrate cassettes 12 in the space above wafer handling module 30, so that the additional substrate cassette storage capacity does not increase the foot print of the system 1. Alternatively, storage locations may be provided in the space of the service area or grey room 81 behind the system 1, preferably above the ergonomic minimum height (SEMI S8; 1980 mm) and/or above the I/O-station module 40.

A service operation of the system 1 of FIG. 1A will now be described with reference to FIGS. 2 and 3.

Figure 2C:
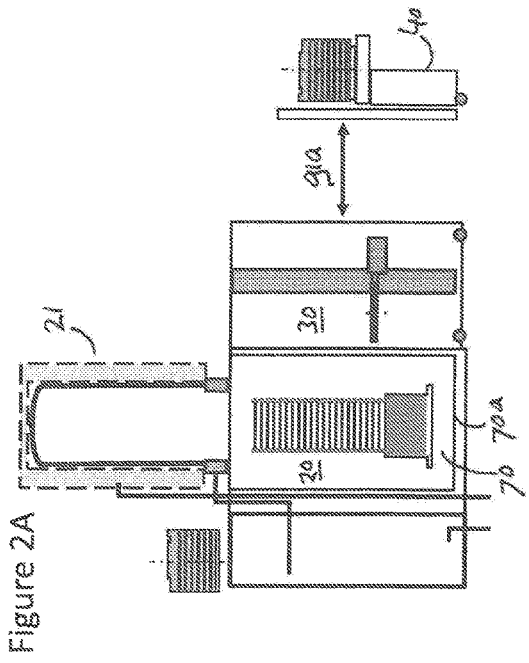
Figure 2B:
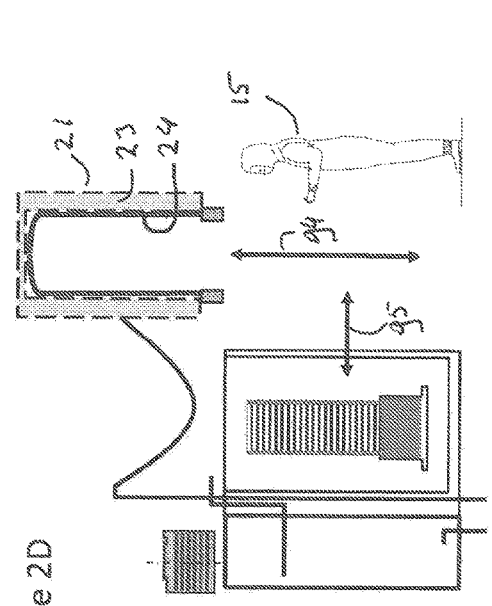
Figure 2D:
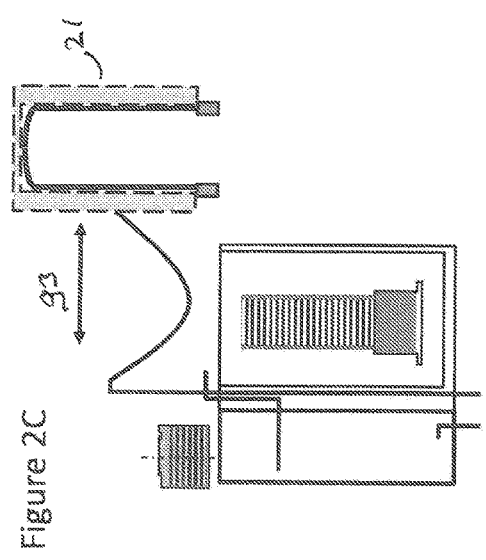
Figure 3B:
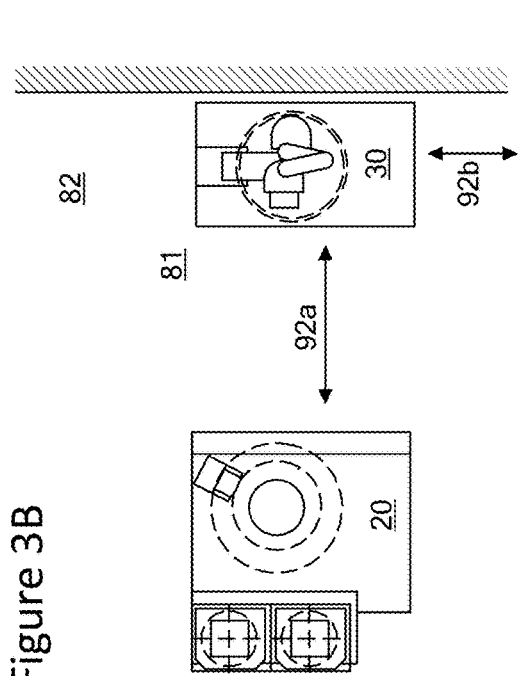
FIG. 3A-3C are top plan views and correspond to FIG. 2A-2C respectively.
Figure 3A:
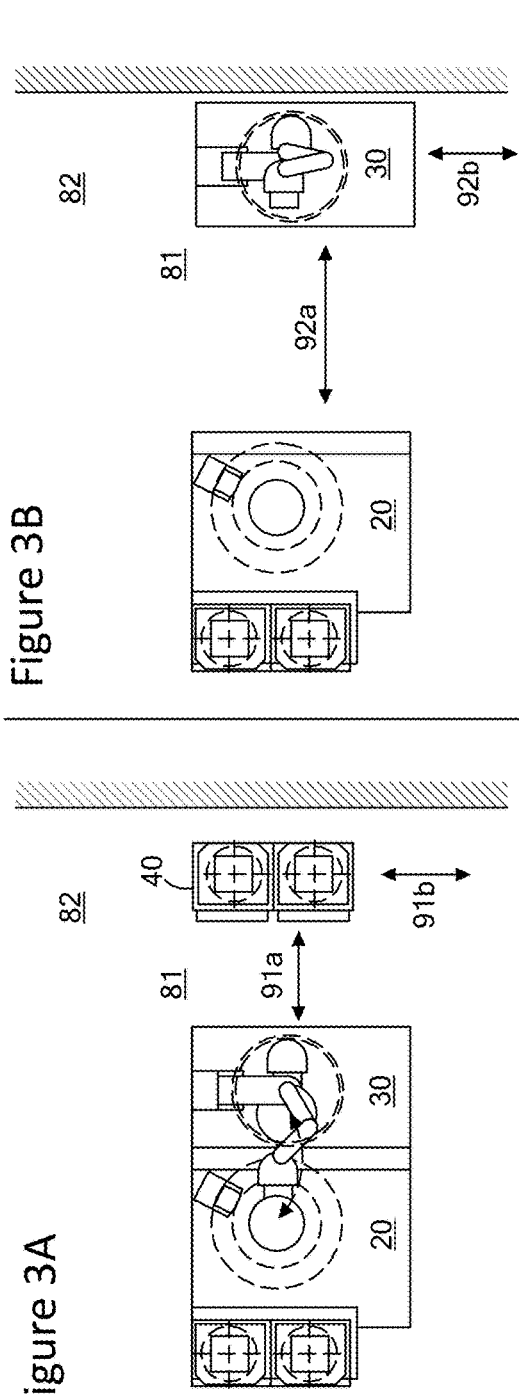
Figure 3C:
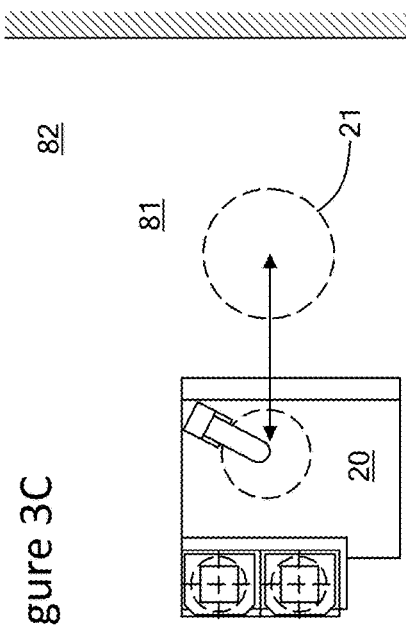

In FIG. 2A, 3A, in a first step 91a, removable I/O-station module 40 may be disconnected and moved apart from wafer handling module 30 into service area or grey room 81; in a second step 91b the I/O-station module 40 may further transported away through corridor 82. In FIG. 2B, 3B, in a first step 92a, wafer handling module 30, including housing 30a and particle filter, may be disconnected and moved apart from processing module 20 into service area 81; in a second step 92b the wafer handling module 30 may further be transported away through corridor 82. In FIG. 2C, 3C, in step 93, the furnace 21 may be moved away from a position above mini-environment 70 into service area or grey room 81 so that it can be serviced. This may be done by, for instance, a slide mechanism or a swing mechanism (not shown). As shown in FIG. 2D, a service engineer 15 may perform service actions such as 94 removing process tube 24 from heating element 23, or 95 removing a boat 26 from mini-environment 70. It will be clear that for the removal of a boat it may not be necessary that furnace 21 is in a moved away position but may still be in its processing position above mini-environment 70. For the removal of process tube 24 a tool may be used. It may be clear that not only the process tube 24 may be removed but also flange 25 and optionally also heating element 23.

A service operation of the system of FIG. 1B will now be described with reference to FIGS. 4 and 5.

Figure 4B:
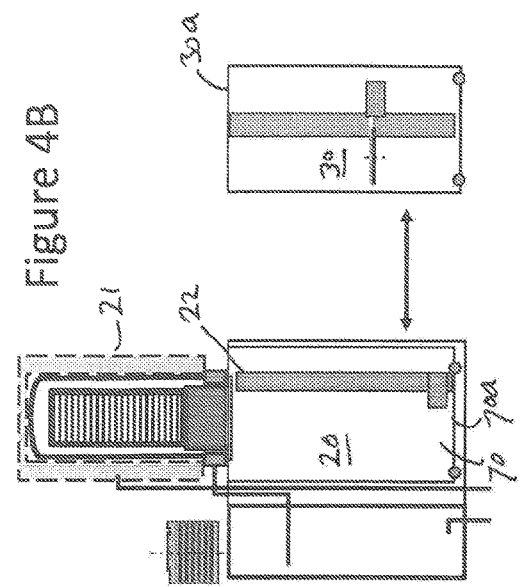
FIG. 4A-4D show in a side view sequential steps in a service operation of the system of FIG. 1B.
Figure 4A:
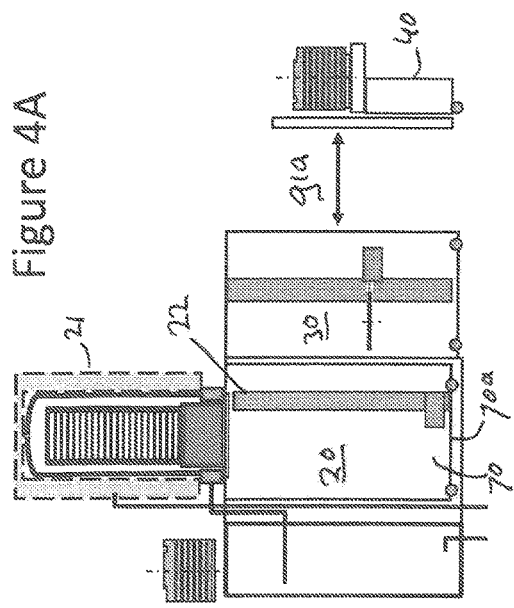
Figure 4D:
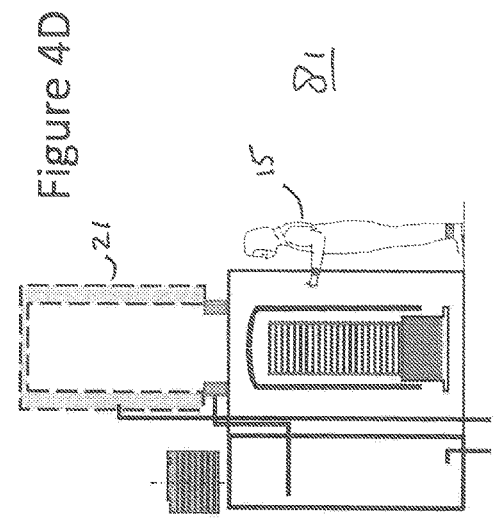
Figure 4C:
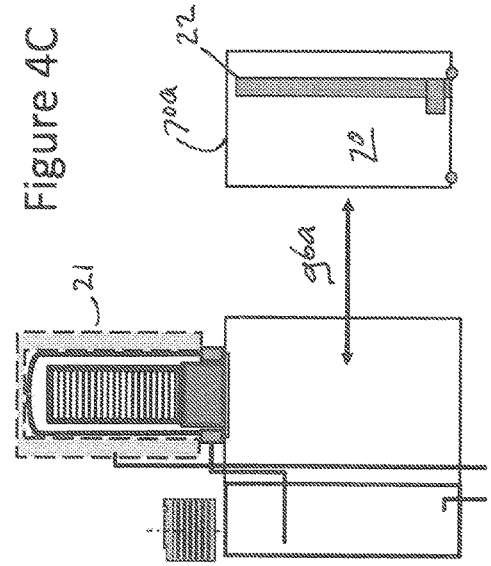

In FIG. 4A, 5A, in a first step 91a, removable I/O-station module 40 is disconnected and moved away from wafer handling module 30 into service area 81 and in a second step 91b transported away through corridor 82. In FIG. 4B, 5B, in a first step 92a, wafer handling module 30, including housing 30a and particle filter, is disconnected and moved away from processing module 20 into service area 81 and in a second step 92b transported away through corridor 82. In FIG. 4C, 5C, in a first step 96a, mini-environment 70, including housing 70a and boat elevator 22 is disconnected and moved away into service area 81 and in a second step 96b transported away through corridor 82. As illustrated in FIG. 4D, 5D, a service engineer 15 may perform service actions, such as removing process tube 24 from heating element 23 or removing a boat 26. For the removal of parts, a tool may be used. I may be clear that not only the process tube 24 or boat 26 may be removed but also flange 25 and optionally also heating element 23.

Figure 6:
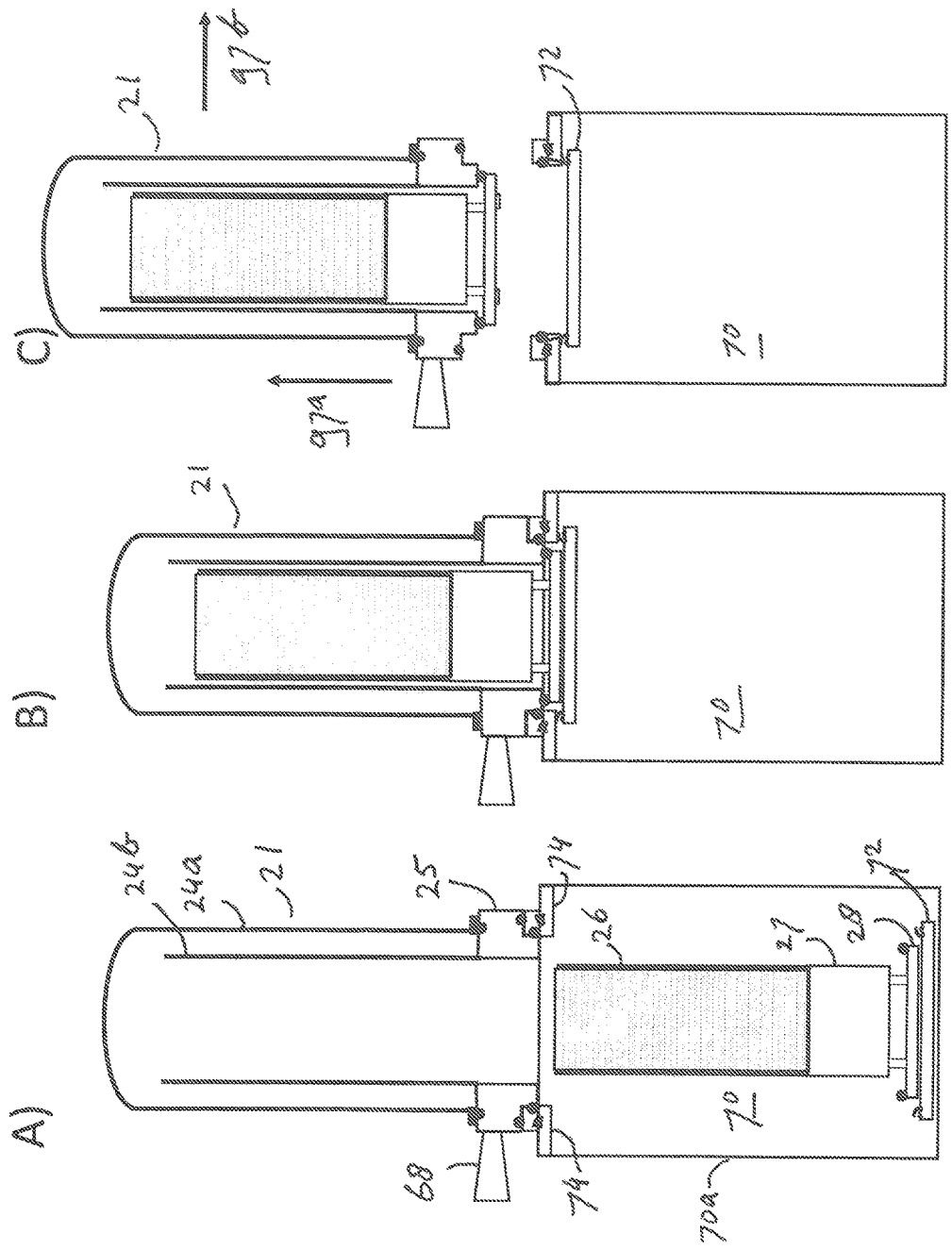
FIG. 6 shows sequential steps in a service operation in further detail.

FIG. 6 shows in further detail a service operation that can be performed in connection with the system as described in FIGS. 2 and 3.

In FIG. 6A, the furnace 21 is in process position and is shown for simplicity without heating element 23. In this embodiment, the furnace is provided with an outer process tube 24a and an inner process tube 24b. The process tubes 24 are supported on flanges 25. This configuration is typically used for low pressure applications wherein the process gases flow in upward direction within inner tube 24a and in downward direction, towards an exhaust opening, in the space between inner process tube 24b and outer process tube 24a. A plenum 68 is in communication with a vacuum pump for exhausting the process gases. A boat 26, supported on pedestal 27, door plate 28 and lower plate 72 is positioned in mini environment 70, enclosed by a housing 70a. An elevator, not shown, may lift the lower plate 72, including door plate 28, pedestal 27 and boat 26 to an uppermost position wherein lower plate 72 seals against a top surface 74 of mini-environment 70 and simultaneously door plate 28 seals against flanges 25, as shown in FIG. 6B. Further, door plate 28 may be secured against flanges 25 with locking means, not shown. Then, as shown in FIG. 6C, the furnace 21 in its entirety might be elevated by action 97a, optionally after disconnection of gas, vacuum and other tubing and connections, as needed. Finally, in an action 97b, the furnace 21 may be moved horizontally away from a position above mini-environment 70, together with wafer boat 26, pedestal 27 and door plate 28 to allow the performance of service actions. During the removal of the furnace, the mini-environment 70 may be sealed by lower plate 72, while the process tube 24 may be sealed by door plate 28, so that contamination during the service operation is avoided.

Figure 7:
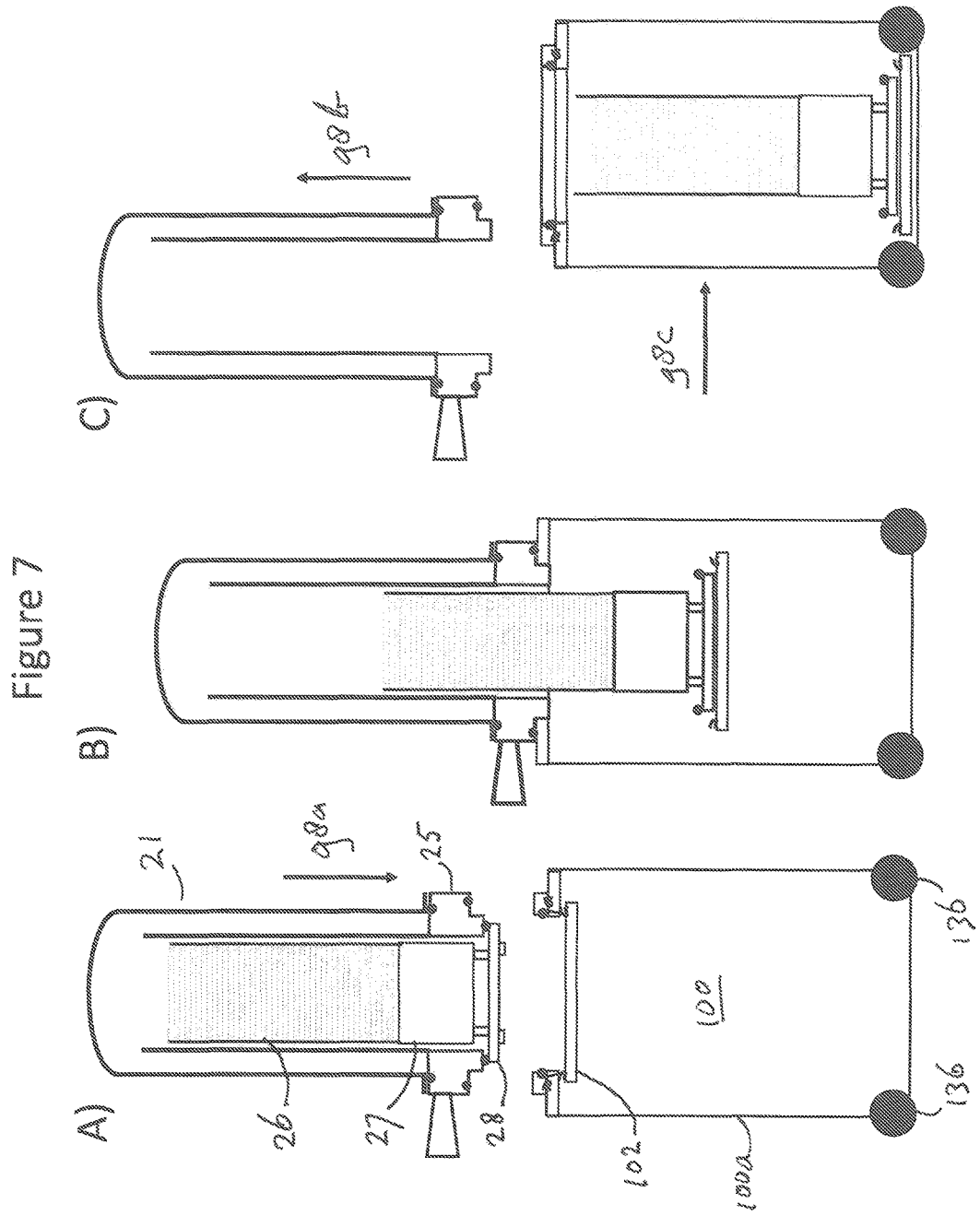
FIG. 7 shows sequential steps in a service operation using a service cart.

In FIG. 7 the use of a service cart 100 that can be used during service procedures of a vertical furnace 21 is illustrated.

The cart 100 may be provided with a housing 100a and a removable closure 102 in an upper wall of the housing. The cart 100 may also be provided with supportive transport means 136, such as, for instance, wheels or preferably air cushion devices for generating air cushions. Air cushions may allow for the practically frictionless displacement of the cart 100 in all directions.

In FIG. 7A, furnace 21 is shown as comprising a boat 26, a pedestal 27 and a doorplate 28; for clarity, a heating element is omitted from the drawing. An available height underneath the furnace 21 may be greater than a height of the cart 100. The cart 100 may be moved underneath the furnace 21. The furnace 21 may be moved relative to the cart 100, in a vertical direction toward the cart 100, so that a lower surface of the furnace 21 sealingly engages an upper surface of the cart 100, and the door plate 28 rests on removable closure 102. In FIG. 7B removable closure 102 is lowered by an elevator (not shown), until the boat 26 is fully accommodated in the housing 100a of the cart 100. Then the furnace 21 is moved relative to the cart 100, in a vertical direction away from the cart 100, so that the furnace 21 and the cart 100 are disengaged. Then, in FIG. 7C, the cart 100, together with its content of boat 26, pedestal 27 and doorplate 28 may be transported away from the furnace 21 in a horizontal direction. During transport, a closure (not shown), may be placed on the top surface of the cart 100 to prevent any contamination from entering the housing 100a of the cart 100 and falling on the boat 26. Similarly, a closure may be placed on the lower surface of the furnace 21 to prevent any contamination from entering the process tube 24.

The cart 100 as shown in FIG. 7 may be used in different ways.

It may be used in connection with the system 1 of FIGS. 2 and 3. When the furnace 21 is in a moved away position, as shown in FIGS. 2C, 2D and 3C, cart 100 may be placed underneath the furnace 21 to receive a boat. Although in FIGS. 2, 3 the boat 26 is left in the mini-environment 70, it is also possible to lift the boat 26 into the furnace 21, and move furnace and boat together sideways. Alternatively, the cart 100 may be designed to receive the flange 25 with the process tube 24.

The cart 100 may also be used in connection with the system 1 of FIGS. 4, 5. When the mini-environment 70 has been removed, the cart 100 may be moved in the space underneath the furnace 21 to receive a boat 26. In a second step, using a second cart 100, the flange 25 with process tube 24 may be received.

The vertical movement of the furnace 21 relative to the cart 100 may be achieved by vertically moving the furnace 21 while the cart 100 is kept stationary. Alternatively, the cart 100 may be moved vertically while the furnace 21 remains stationary. In the embodiment of FIGS. 1B, 4 and 5, where there is no need to displace the furnace 21 horizontally during a service operation like a tube exchange, it may simplify the entire operation if the furnace 21 also remains vertically stationary.

Although with reference to the Figures it has been described that the modules are removed one by one, as an alternative it is possible to remove the modules jointly. E.g. it would be possible to remove the I/O-station module 40 and wafer handling module 30 from the system 1 jointly, in a connected together state. It would even be possible to remove I/O-station module 40, wafer handling module 30 and mini-environment 70 in a connected together state. Removal a combination of modules may requires more space to manoeuvre, and may be difficult to perform, but may save time since fewer internal connections need to be disconnected upon removal and reconnected upon repositioning.

In one embodiment, at least one of the I/O-ports of the I/O-station module 40 may be provided at a height specified by SEMI for Personal Guided Vehicles (PGV). This may allow loading by PGV when the OHT system 50 malfunctions or during startup of the system 1.

In another embodiment, the system 1 may be provided with a facility for purging the FOUPs with an inert gas after receipt in the system 1.

In another embodiment, the substrate cassette transport system 52 may be configured such that a substrate cassette 12 is exchangeble between neighbouring systems 1, without interaction of the OHT system.

In yet another embodiment a wafer handling module 30 of a processing system 1 is provided with a coupling provision provided in at least one of the side walls of the housing 30a, and configured for cooperation with a coupling provision of the wafer handling module 30 of another processing system so as to interconnect the respective processing units and to define an optionally closable substrate transfer passage between the wafer handling modules, as disclosed in U.S. patent application Ser. No. 13/248,468, co-assigned herewith.

In still another embodiment the system 1 may be provided with a store for storing a batch of wafers, e.g. a rack disposed in the mini-environment 70 at a side thereof holding a plurality of wafers in a vertically spaced arrangement. The store may be accessible by the wafer handling robot 33, and be used as, for instance, a cool-down location for wafers. Alternatively the store might be located in the wafer handling module 30 or even at a location intermediate between the wafer handling module 30 and the mini-environment 70.

The invention has been described in relation to a bay lay-out of the clean room wherein a substrate cassette receiving side of the system is facing the clean room and an opposing side of the system is placed in a service area. However, a ball room lay-out may be used wherein an entire system is placed within a clean room and wherein there is no distinction anymore between clean room 80 and service area 81. It will be obvious that a system 1 of the invention, having disconnectable and reconnectable modules provides similarly in a ball room lay-out the advantage of a close, side by side packing of system while access for service is provided by disconnecting and removing one or more modules.

It may be obvious that the modular design of the vertical furnace processing system does not only have advantages for servicing but has also many advantages during manufacturing, testing and installation of systems. E.g. a module can be easily connected to another system for testing. And during installing a system at an end users' facility, the modules can be transported in their entirety and quickly coupled together, reducing installation time.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

Figure 8:
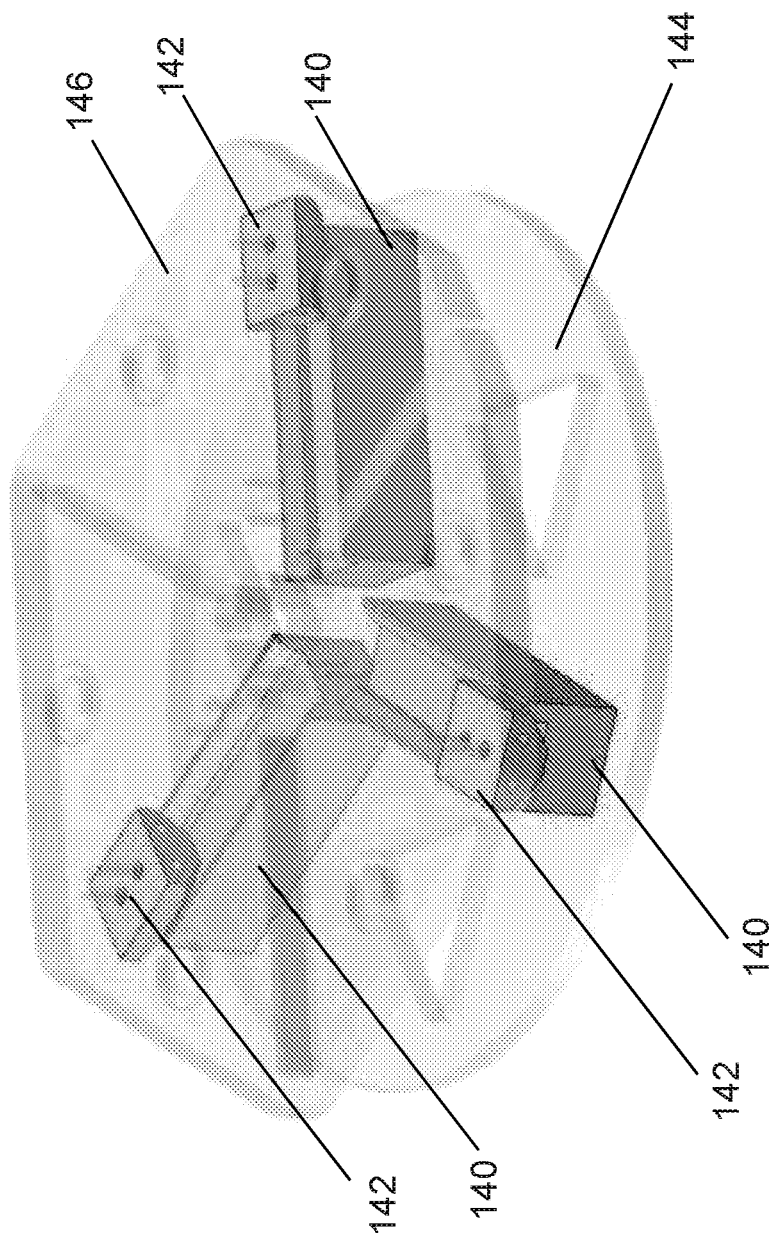
FIG. 8 shows a perspective view of an example of a kinematic coupling.

When removing wafer handling module 30 and repositioning it again, it is important that the module is repositioned at the same position that it had before removing to ensure proper alignment of the wafer handling robot relative to the processing module 20. This can be achieved by supporting the wafer handling module 30 on a kinematic coupling, similar to the kinematic coupling of a FOUP cassette, see FIG. 8. Such a coupling comprises three stationary blocks 140 having a V-groove in which a mating element 142 fits. The mating element 142 can be a sphere or an element having partly a spherical surface. The block 140 and element 142 accurately position relative to each other and have a high span of correction for any misalignment at the beginning of the positioning procedure. The stationary blocks may be fixedly connected to a first base plate 144 and the mating elements 142 may be mounted on a second base plate 146. The first base plate 144 may, for example, be placed on the floor and the second base plate 146 may be mounted on the bottom of, for example, the processing module 20 and/or the wafer handling module 30. Nowadays, kinematic couplings are available for high payloads. The kinematic coupling can also be used in vertical orientation, to define the position and orientation of two side surfaces of the two modules relative to each other. In that case the first base plate 144 of at least one kinematic coupling may be mounted on a side wall of, for example, the processing module 20 and the second base plate 146 said kinematic coupling may be mounted on a side wall of, for example, the wafer handling module 30. In addition, auto levelling can be used, using jack lifts in combination with a level sensor for positioning the two modules 20, 30 relative to each other.

Another critical item is the sealing between the wafer handling module 30 and the processing module 20 to obtain integrity of the mini-environment after repeated removal and replacement of the wafer handling module 30 and/or the mini-environment of the processing module 20. For this purpose the seal between the wafer handling module 30 and the mini-environment of the process module 20 can be made flexible, such that a hermetic seal is achieved without exerting significant forces on the modules 20, 30 that would result in deformation. An inflatable seal is proposed. FIGS. 9A to 9C show an example of an embodiment of a flexible seal 156, more particularly an inflatable seal, in a cross section along a horizontal plane through the gate 150 of the processing module 20 and through the gate 152 of the wafer handling module 30. Preferably, a double inflatable seal 156 is used on the side surface of one module, in example shown in FIG. 9 on the side surface 154 of the processing module 20, in combination with a collar 160 on the side surface 158 of the other module, in the example shown in FIG. 9 on the side surface 158 of the wafer handling module 30. The collar 160 may be a rigid metal collar 160 or a flexible collar 160. By moving the two modules 20, 30 towards each other, the collar 160 is moved (as indicated with arrow A in FIG. 9A) in between the double inflatable seal 156 when the seal is in non-inflated condition (as shown in FIG. 9B). Then the double seal 156 is inflated and seals against both sides of the collar 160 (as shown in FIG. 9C). In this way a minimum of forces are exerted by the inflatable seal 156 and the collar 160 on the respective modules 20, 30 while obtaining adequate sealing. Furthermore, the seal is not affected by small displacements of the modules 20, 30 in a direction away from or toward each other.

In an embodiment of the invention, the substrate cassette I/O-station module 40 with the load port may be mounted on the wafer handling module 30 and both modules 40, 30 may be removed simultaneously, as one piece.

LIST OF ELEMENTS 1 vertical furnace processing platform
10 substrate cassette receiving platform
12 substrate cassette
14 operator
15 service engineer
20 processing module
20a housing
21 vertical furnace
22 boat elevator
23 heating element
24 process tube
24a outer process tube
24b inner process tube
25 flange
26 wafer boat
27 pedestal
28 door plate
30 wafer handling module
30a housing 33 wafer handling robot
34 axis
35 multi axis arm
36 supportive transport means
40 substrate cassette I/O-station module
42 storage (locations) for substrate cassettes
50 Over Head Transport (OHT) system
52 substrate cassette transport system
60 gas supply module
62 gas conduit between gas supply module and vertical furnace
64 permanent high-power connection between facilities and heating element of vertical furnace
66 permanent gas connection between facilities and gas supply module
68 plenum
70 mini-environment
70a housing
72 lower plate
74 top surface of mini-environment
80 clean room
81 service area/grey room
82 corridor
91a,b first (a) and second (b) step in removing I/O-station module 40
92a,b first (a) and second (b) step in removing wafer handing module 30
93 step of removal of furnace from above mini-environment
94 step of removal of process tube
95 step of removing boat from mini-environment
97a action of elevating furnace
97b action of horizontally moving furnace away from above mini-environment
100 service cart
100a housing
102 removable closure
136 supportive transport means
140 stationary blocks
142 mating element
144 first base plate
146 second base plate
150 gate of processing module
152 gate of wafer handling module
154 side surface of the processing module
156 double inflatable seal
158 side surface of the wafer handling module
160 collar

We claim:

1. A vertical furnace processing system for processing semiconductor substrates, comprising the following modules:
a processing module including a vertical furnace;
an input/output-station module including at least one load port to which a substrate cassette is dockable;
a wafer handling module configured to transfer semiconductor substrates between the processing module and a substrate cassette docked to the load port of the input/output-station module; and
a gas supply module including at least one gas supply or gas supply connection for providing the vertical furnace of the processing module with process gas,
wherein at least two of the said modules are mutually decouplably coupled, such that said at least two modules are decouplable from one another to facilitate servicing of the system, and in particular the vertical furnace thereof, wherein the at least two of the said modules that are mutually decouplably coupled include the wafer handling module and the processing module, wherein at least one of said at least two decouplably coupled modules includes supportive transport means configured to support said module on a floor and to facilitate transport of said module over said floor, wherein the system has a clean room facing first side and a second side, and wherein, in an operational state of the system, the modules of the system are arranged in the following order, seen from the clean room facing first side to the second side: the gas supply module, the processing module, the wafer handling module, and the input/output-station module, wherein the system further comprises:
a substrate cassette receiving platform, disposed at the clean room facing first side of the system;
a substrate cassette transport mechanism configured to transport substrate cassettes between the substrate cassette receiving platform and the input/output-station module.

2. The vertical furnace processing system according to claim 1, wherein the input/output-station module is decouplably coupled to the wafer handling module.

3. The vertical furnace processing system according to claim 2 wherein:
the wafer handling module is decouplably coupled to the processing module;
the processing module further includes:
a mini-environment that is configured to be arranged below the vertical furnace during operation of the system,
wherein the vertical furnace is decouplably coupled to the gas supply module and/or wherein the mini-environment is decouplably coupled to the wafer handling module;
said at least two decouplably coupled modules are operably connected by a gas connection line configured to enable the exchange of process gas between said modules, and
wherein said gas connection line includes a connector that facilitates the quick coupling and decoupling of the operably connected modules by facilitating break-up and restoration of the gas connection via said gas connection line;
one of the modules houses a controller,
wherein said controller is operably connected to at least another one of said modules via electrical signal lines, and
wherein said electrical signal line includes a connector that facilitates the quick coupling and decoupling of the operably connected modules by facilitating break-up and restoration of the electrical connection via said electrical signal line;
at least one of said at least two decouplably coupled modules includes supportive transport means configured to support said module on a floor;
said supportive transport means includes a gas bearing device configured to generate a gas bearing between a floor facing support surface of the module and the floor;
the system further comprises a substrate cassette storage for temporarily storing at least one substrate cassette;
the vertical furnace of the processing module includes at least one of: a process tube defining an interior processing space that is configured to accommodate a wafer boat, a heating element configured to heat an interior processing space of the vertical furnace, and a plate configured to releasably seal an interior processing space of the vertical furnace;

the mini-environment includes at least one of: a housing defining an interior space configured to receive a wafer boat, a particle filter for filtering particles from an atmosphere inside an interior space of the mini-environment, gas/air circulation means for circulating gas/air inside an interior space of the mini-environment, cooling means for removing heat from an interior space of the mini-environment.

4. The system according to claim 3, wherein the wafer handling module includes at least one of: a housing defining an interior wafer handling space, a wafer handling robot configured to transfer semiconductor substrates between the processing module and a substrate cassette docked to the load port of the input/output-station module via an interior wafer handling space of the wafer handling module, a particle filter for filtering particles from an atmosphere inside an interior wafer handling space of the wafer handling module, and gas/air circulation means for circulating gas/air inside an interior space of the wafer handling module.

5. The vertical furnace processing system according to claim 3, wherein the system has a clean room facing first side and a second side, and
wherein, in an operational state of the system, the modules of the system are arranged in the following order, seen from the clean room facing first side to the second side: the gas supply module, the processing module, the wafer handling module, and the input/output-station module; and
further comprising:
a substrate cassette receiving platform, disposed at the clean room facing first side of the system;
a substrate cassette transport mechanism configured to transport substrate cassettes between the substrate cassette receiving platform and the input/output-station module.

6. The vertical furnace processing system according to claim 1, wherein the processing module further includes:
a mini-environment that is configured to be arranged below the vertical furnace during operation of the system,
wherein the vertical furnace is decouplably coupled to the gas supply module and/or wherein the mini-environment is decouplably coupled to the wafer handling module.

7. The vertical furnace processing system according to claim 6, wherein the mini-environment includes at least one of: a housing defining an interior space configured to receive a wafer boat, a particle filter for filtering particles from an atmosphere inside an interior space of the mini-environment, gas/air circulation means for circulating gas/air inside an interior space of the mini-environment, cooling means for removing heat from an interior space of the mini-environment.

8. The vertical furnace processing system according to claim 1, wherein said at least two decouplably coupled modules are operably connected by a gas connection line configured to enable the exchange of process gas between said modules, and
wherein said gas connection line includes a connector that facilitates the coupling and decoupling of the operably connected modules by facilitating break-up and restoration of the gas connection via said gas connection line.

9. The vertical furnace processing system according to claim 1, wherein one of the modules houses a controller,
wherein said controller is operably connected to at least another one of said modules via electrical signal lines, and
wherein said electrical signal line includes a connector that facilitates the coupling and decoupling of the operably connected modules by facilitating break-up and restoration of the electrical connection via said electrical signal line.

10. The vertical furnace processing system according to claim 1, wherein the supportive transport means are configured to support said module on a floor.

11. The vertical furnace processing system according to claim 10, wherein said supportive transport means includes a gas bearing device configured to generate a gas bearing between a floor facing support surface of the module and the floor.

12. The vertical furnace processing system according to claim 10, wherein the supportive transport means comprises wheels and is further configured to facilitate transport of the module over said floor.

13. The vertical furnace processing system according to claim 1, further comprising a substrate cassette storage for temporarily storing at least one substrate cassette.

14. The vertical furnace processing system according to claim 13, wherein the substrate cassette storage is disposed above the wafer handling module.

15. The vertical furnace processing system according to claim 1, wherein the vertical furnace of the processing module includes at least one of: a process tube defining an interior processing space that is configured to accommodate a wafer boat, a heating element configured to heat an interior processing space of the vertical furnace, and a plate configured to releasably seal an interior processing space of the vertical furnace.

16. The system according to claim 1, wherein the wafer handling module includes at least one of: a housing defining an interior wafer handling space, a wafer handling robot configured to transfer semiconductor substrates between the processing module and a substrate cassette docked to the load port of the input/output-station module via an interior wafer handling space of the wafer handling module, a particle filter for filtering particles from an atmosphere inside an interior wafer handling space of the wafer handling module, and gas/air circulation means for circulating gas/air inside an interior space of the wafer handling module.

17. A semiconductor processing facility, comprising:
a clean room;
a grey room, having a cleanliness lower than that of the clean room;
a vertical furnace processing system according to claim 16, said vertical furnace processing system being partially disposed inside the clean room and partially disposed inside the grey room, such that its clean room facing side faces the clean room and is accessible therefrom, while its second side faces the grey room and is accessible therefrom.

18. The semiconductor processing facility according to claim 17, further comprising:
an over head transport system configured to transport substrate cassettes between the clean room and the load port of the input/output-station module of the vertical furnace processing system in the grey room.

19. The semiconductor processing facility according to claim 18, wherein a clean corridor—having a substantially same cleanliness as the clean room—is provided that interconnects, on the one hand, the clean room and, on the other hand, the load port of the input/output-station module of the vertical processing system, via which clean corridor the over head transport system is configured to transport substrate cassettes between the clean room and the load port.

20. A method of servicing a vertical furnace processing system, comprising:

providing a vertical furnace processing system according to claim 1;

decoupling the at least two decouplably coupled modules from one another, and spatially separating them; and servicing the system using space rendered available by spatially separating the decoupled modules.

21. The method according to claim 20, wherein decoupling said at least two decouplably coupled modules from one another includes:

decoupling the input/output-station module from the wafer handling module.

22. The method according to claim 20, wherein decoupling said at least two decouplably coupled modules from one another includes:

decoupling the wafer handling module from the processing module.

23. The method according to claim 20, wherein the method further comprises:

decoupling at least one of the vertical furnace and a mini-environment of the processing module from at least one of the other modules of the vertical furnace processing system.

24. A vertical furnace processing system for processing semiconductor substrates, comprising the following modules:

a processing module including a vertical furnace;

an input/output-station module including at least one load port to which a substrate cassette is dockable;

a wafer handling module configured to transfer semiconductor substrates between the processing module and a substrate cassette docked to the load port of the input/output-station module; and a gas supply module including at least one gas supply or gas supply connection for providing the vertical furnace of the processing module with process gas, wherein at least two of the said modules are mutually decouplably coupled, such that said at least two modules are decouplable from one another to facilitate servicing of the system, and in particular the vertical furnace thereof, wherein said at least two decouplably coupled modules are operably connected by a gas connection line configured to enable the exchange of process gas between said modules, and wherein said gas connection line includes a connector that facilitates the preferably quick coupling and decoupling of the operably connected modules by facilitating break-up and restoration of the gas connection via said gas connection line.

* * * * *